United States Patent
Patterson

(10) Patent No.: US 6,833,800 B1
(45) Date of Patent: Dec. 21, 2004

(54) DIFFERENTIAL COMPARATOR SYSTEMS WITH ENHANCED DYNAMIC RANGE

(75) Inventor: Gregory Wayne Patterson, Jamestown, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/665,827

(22) Filed: Sep. 17, 2003

(51) Int. Cl.$^7$ .............................................. H03M 1/00
(52) U.S. Cl. ...................................... 341/134; 341/155
(58) Field of Search ................................. 341/134, 155, 341/156, 118, 161, 120, 139, 158, 159

(56) References Cited

U.S. PATENT DOCUMENTS

| | | | |
|---|---|---|---|
| 5,231,399 A | | 7/1993 | Gorman et al. ............. 341/159 |
| 5,539,406 A | * | 7/1996 | Kouno et al. ............... 341/155 |
| 5,589,831 A | | 12/1996 | Knee ......................... 341/159 |
| 5,706,008 A | | 1/1998 | Huntley et al. ............. 341/156 |
| 5,990,814 A | | 11/1999 | Croman et al. ............. 341/118 |
| 6,014,097 A | | 1/2000 | Brandt ....................... 341/156 |
| 6,407,692 B1 | * | 6/2002 | Bult et al. .................. 341/159 |
| 6,452,519 B1 | | 9/2002 | Swanson ..................... 341/120 |
| 6,650,267 B2 | * | 11/2003 | Bult et al. .................. 341/155 |

OTHER PUBLICATIONS

Petschacher, Reinhard, et al, "A 10b, 75MSPS Subranging A/D Converter with Integrated Sample and Hold", IEEE Journal of Solid–State Physics, vol. 25, No. 6, Dec., 1990.
Waltari, Mikko, et al, "reference Voltage Drive for Low Voltage CMOS A/D Converters", IEEE International Conference on Electronics, Circuits and Systems, vol. 1, No. 6, 2001.

* cited by examiner

Primary Examiner—Brian Young
Assistant Examiner—Joseph Lauture
(74) Attorney, Agent, or Firm—Koppel, Jacobs, Patrick & Heybl

(57) ABSTRACT

Comparator systems are provided that substantially enhance comparator dynamic range. The enhancement is primarily realized by arranging the systems to apply comparator input signals at feedback taps positioned between the upper and lower ends of comparator strings of impedance elements.

20 Claims, 3 Drawing Sheets

DIFFERENTIAL COMPARATOR SYSTEMS WITH ENHANCED DYNAMIC RANGE

BACKGROUND OF THE INVENTION

1. Field of the Invention

The present invention relates generally to comparator systems.

2. Description of the Related Art

On-going developments in photolithographic and electron-beam lithographic processes have realized successively smaller dimensions for integrated-circuit interconnect structures. Although these reduced structures have facilitated an impressive increase in the package density of integrated-circuit components (e.g., logic gates), they have also limited the supply voltage (generally indicated by $V_{dd}$ for metal-oxide-semiconductor (MOS) transistors and by $V_{cc}$ for bipolar junction transistors) that can be applied to bias these components. The limited supply voltages (e.g., 3.3 volts) are primarily for protection of MOS gate structures but the same limitations are imposed on the design of all components in combined-technology integrated circuits, e.g., those that combine MOS and bipolar junction devices.

In every electronic circuit, the available supply voltage must be divided between component headroom (minimum voltage needed for device operation) and dynamic range (difference between least and greatest processed signals). The more headroom a given circuit design requires, the less dynamic range it can provide. In particular, conventional differential comparator structures (e.g., as in flash analog-to-digital converters) have typically required substantial headroom and, accordingly, their dynamic range has suffered as the available supply voltage has declined.

BRIEF SUMMARY OF THE INVENTION

The present invention is directed to differential comparator systems that substantially enhance comparator dynamic range.

The novel features of the invention are set forth with particularity in the appended claims. The invention will be best understood from the following description when read in conjunction with the accompanying drawings.

DETAILED DESCRIPTION OF THE INVENTION

Figure 2:
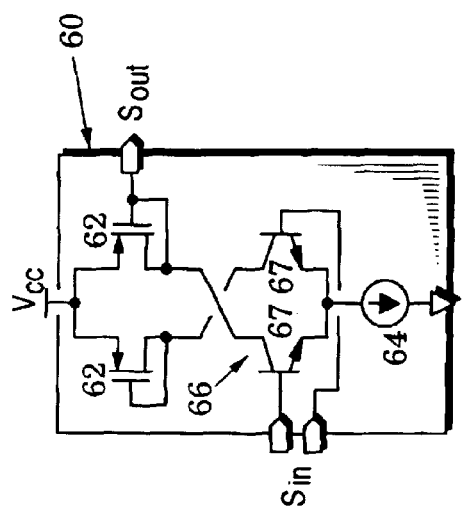
FIG. 2 is a schematic diagram of a differential amplifier in the comparator of FIG. 1.
Figure 3:
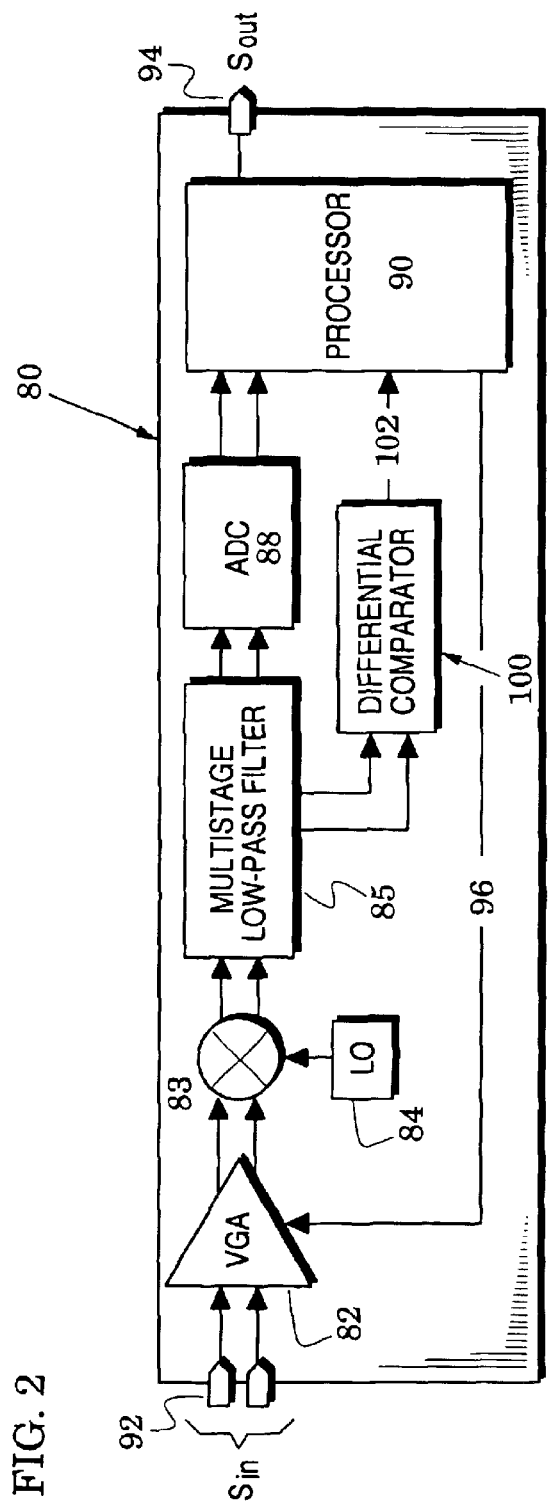
FIG. 3 is a block diagram of a receiver embodiment that includes a comparator system of the invention.

Comparator systems of the invention substantially enhance comparator dynamic range. This enhancement is described with reference to the embodiments 20 and 120 of FIGS. 1 and 4. FIG. 3 illustrates a receiver formed with the teachings of the invention and FIG. 2 shows an exemplary differential amplifier in the comparator systems.

Figure 1:
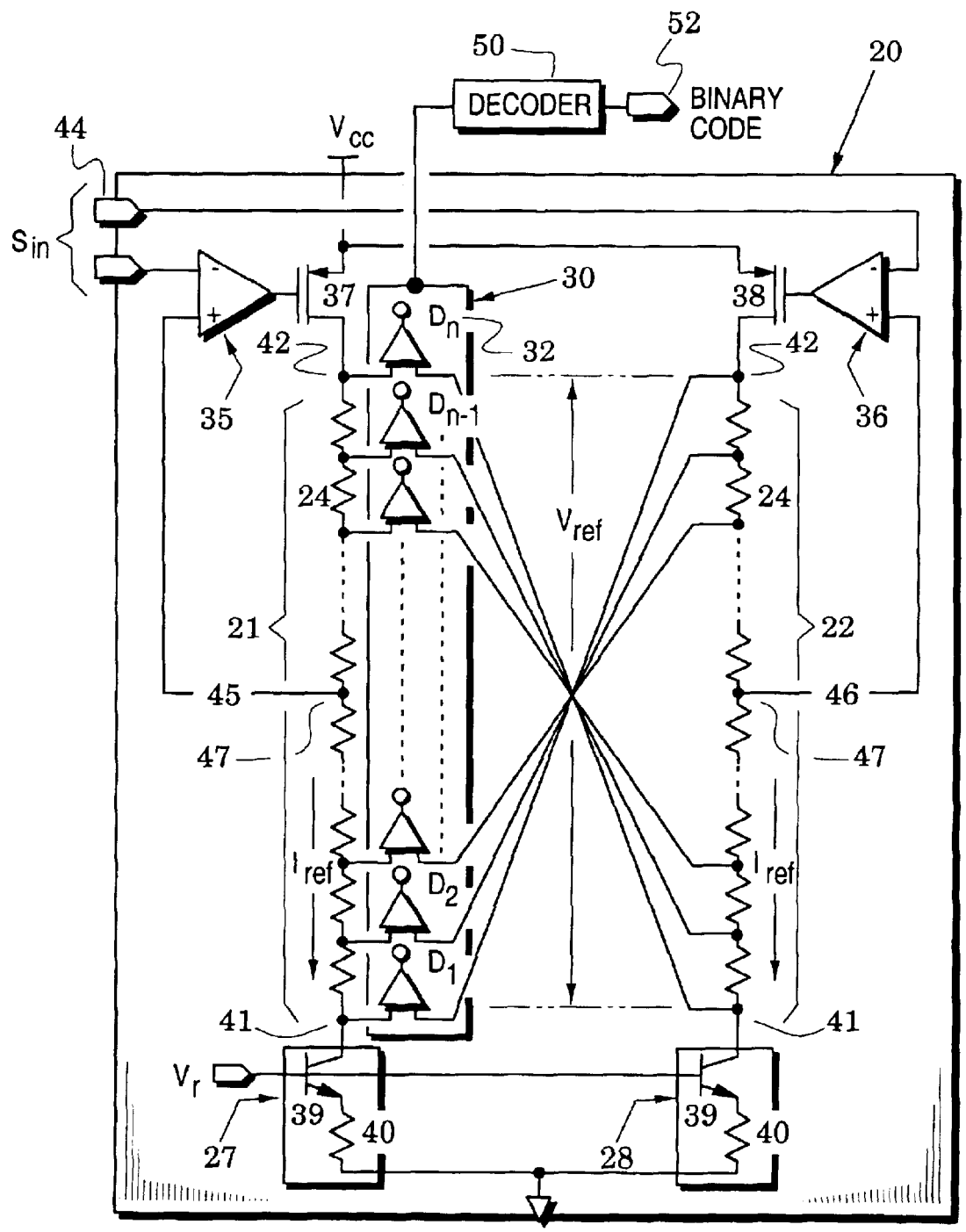
FIG. 1 is a schematic diagram of a differential comparator system embodiment of the present invention.

In particular, FIG. 1 illustrates a differential comparator system 20 that includes first and second strings 21 and 22 of serially-connected impedance elements 24, first and second current sources 27 and 28, a set 30 of comparators 32, first and second differential amplifiers 35 and 36, and first and second MOS pass transistors 37 and 38. Each current source comprises a bipolar junction transistor 39 that receives a bias $V_r$ and is in series with a degeneration resistor 40.

The current sources 27 and 28 are respectively coupled to first (lower) ends 41 of the first and second strings 21 and 22. The first and second transistors 37 and 38 are respectively inserted between the differential amplifiers 35 and 36 and second (upper) ends 42 of the first and second strings. The inputs of each of the comparators 32 are coupled between a respective string tap of the first string 21 and a respective string tap of the second string 22 (ends and junctions of the impedance elements 24 define the taps). The comparators are shown to provide comparator output signals $D_1$, $D_2$ - - - $D_{n-1}$, $D_n$.

In an important feature of one embodiment of the invention the differential amplifiers have inverting input terminals coupled to form a differential input port 44 and have noninverting input terminals that are coupled through respective feedback paths 45 and 46 to feedback taps 47 that are positioned between the first and second ends 41 and 42 of the strings 21 and 22.

The current sources 27 and 28 attempt to draw a reference current $I_{ref}$ through the total resistance $R_t$ of each of the strings 21 and 22 to thereby establish the system's reference voltage $V_{ref}(I_{ref}R_t)$ across the strings. The feedback signals through the feedback paths 45 and 46 cause the differential amplifiers 35 and 36 to adjust gate voltages so that currents through the pass transistors 37 and 38 match the reference currents $I_{ref}$.

When the differential input signal at the input port 44 is zero, the cross coupling of the inputs of the comparators 32 (across the strings 21 and 22) causes a bias voltage $V_{ref}$ of one polarity to appear at the inputs of the comparator $D_1$ and a bias voltage $V_{ref}$ of opposite polarity to appear at the inputs of the comparator $D_n$. The bias voltages at the other comparators are successively spaced between these extremes.

The high gain of the differential amplifiers 35 and 36 insures that (to a first approximation) the signals at the noninverting input terminals of the differential amplifiers 35 and 36 substantially match the signals at the inverting input terminals so that the input signal at the input port 44 is applied at the feedback taps 47 of the first strings 21 and 22. Therefore, in an important feature of the invention, the input signals at the input port 44 are applied across the feedback taps 47 of the first and second strings 21 and 22.

In operation of the system 20, a differential input signal $S_{in}$ at the input port has a differential voltage amplitude $2\Delta V$ centered about a common-mode voltage $V_{cm}$. In one signal extreme, a voltage $V_{cm}+\Delta V$ appears at the inverting input of the differential amplifier 35 (and at the feedback tap 47 associated with the feedback path 45) and a voltage $V_{cm}-\Delta V$ appears at the inverting input of the differential amplifier 36 (and at the feedback tap 47 associated with the feedback path 46). It is noted that the pass transistors 37 and 38 insert a signal inversion so that the feedback paths 45 and 46 apply inverting signals that stabilize the feedback loops.

Because the current sources 27 and 28 present large impedances at the first ends 41 of the strings 21 and 22 (relative to the string impedances), the signal voltages +$\Delta V$ and −$\Delta V$ appear at all string taps of their respective strings. In effect, the string 21 is lifted +$\Delta V$ and the string 22 is depressed −$\Delta V$. When $2\Delta V$ exceeds $V_{ref}$, the initial $V_{ref}$ bias at the $D_1$ comparator is overcome and its output signal changes state.

In a different signal extreme, a voltage $V_{cm}-\Delta V$ appears at the inverting input of the differential amplifier 35 and a voltage $V_{cm}+\Delta V$ appears at the inverting input of the differential amplifier 36. When $2\Delta V$ exceeds $V_{ref}$, the initial $V_{ref}$ bias at the $D_n$ comparator is overcome and its output signal changes state. The comparator 20 thus has a full-scale range of $2V_{ref}$. The output signals of the other comparators change state for input signals spaced between these two extremes so that changed states of the output signals $D_2 - - - D_{n-1}$ indicate a range of increasing signal levels between these extremes.

As mentioned above, the high gain of the differential amplifiers 35 and 36 insures that the input signals at the input port 44 are applied across the feedback taps 47 of the first and second strings 21 and 22. If it is assumed that the feedback taps 47 are positioned at the middle of the strings 21 and 22, $V_{ref}/2$ will appear across each of the upper portions (above the taps 47) and the lower portions (below the taps 47) of the strings 21 and 22. The analog signal at the feedback tap 47 of the first string 21 will be at a minimum when the input signal at the differential amplifier 35 is $V_{cm}-\Delta V_{max}$. The minimum voltage $V_{cs}$ across the current source 27 is thus $$V_{cm}-\Delta V_{max}-V_{ref}/2 \qquad (1)$$

because $V_{ref}/2$ separates the feedback tap 47 from the current source 27.

The signal at the feedback tap 47 of the first string 21 will be at a maximum when the input signal at the differential amplifier 35 is $V_{cm+\Delta Vmax}$. The minimum voltage $V_{37}$ across the transistor 37 is thus $$V_{cc}-(V_{cm}+\Delta V_{max})-V_{ref}/2 \qquad (2)$$

If the system 20 of FIG. 1 has a peak-to-peak differential full-scale range of 2 volts, then $V_{ref}$ equals 1 volt and the maximum $\Delta V_{max}$ is 0.5 volts. Assuming the system has a supply voltage $V_{cc}$ of 3.3 volts, the common-mode voltage $V_{cm}$ is preferably set at one half of this or 1.65 volts.

With reference to equation (1), the minimum voltage $V_{cs}$ across the current source 27 then becomes 1.65−0.5−0.5= 0.65 volts which is sufficient to keep the current source 27 out of saturation. With reference to equation (2), the minimum voltage $V_{37}$ across the transistor 37 becomes 3.3− 1.65−0.5−0.5=0.65 volts which is sufficient to keep the transistor 37 out of the triad region.

In these exemplary calculations, it was assumed that the feedback taps 47 were positioned midway between the first and second ends 41 and 42 of the strings 21 and 22. If desired, this positioning can be altered to allocate the remaining voltage differently between the current sources 27 and 28 and the pass transistors 37 and 38. For example, the minimum voltage across the current sources could be increased at the cost of reducing the minimum voltage across the pass transistors.

In this example, the system 20 is able to achieve a dynamic range of 2 volts while operating with a supply voltage of only 3.3 volts. The advantages of comparator systems of the invention become apparent if its dynamic range is compared to that of a conventional comparator in which the input signal is applied to the first ends 42 of the first and second strings 21 and 22 with bipolar transistors arranged as emitter followers.

In contrast to the system 20 of FIG. 1, the input signal in the conventional comparator is applied via emitter followers at the first ends 42 of the first and second strings 21 and 22 rather than at the feedback taps 47 of the strings. The voltage $V_{cs}$ across the current source 27 is separated from this signal application point by the reference voltage $V_{ref}$ across the entire string 21. Accordingly, the minimum voltage $V_{cs}$ across the current source 27 is now $$(V_{cm}-\Delta V_{max})-V_{be}-V_{ref} \qquad (3)$$

in which $V_{be}$ is the voltage drop of approximately 0.8 volt across the associated emitter follower at the first end 42 of the string 21. To maintain $V_{cs}$ at a minimum of 0.65 volts as was done previously in the system 20, the reference voltage $V_{ref}$ must now be reduced to approximately 133 millivolts which means the conventional comparator system would have a dynamic range of approximately 266 millivolts. This is a substantial degradation (approximately 17.5 dB) of the 2 volt dynamic range of the system 20 of FIG. 1.

The converter code provided by the comparators 32 of FIG. 1 is essentially a "thermometer cod" in which the lower comparators change state as the $\Delta V$ component of the input signal successively increases positively and the upper comparators successively change state as the $\Delta V$ component of the input signal successively increases negatively. It is generally desired that an analog-to-digital converter (ADC) provide a different digital code, e.g., a binary code. The comparator system 20 of FIG. 1 is thus altered to an ADC by the addition of the decoder 50 which provides a binary code at an ADC output port 52.

The differential amplifiers 35 and 36 of FIG. 1 can be realized with various conventional structures. For example, FIG. 2 illustrates an amplifier 60 that includes diode-coupled transistors 62, a current source 64 and a differential pair 66 of transistors 67. The differential pair receives the input signal $S_{in}$ and, in response, steers the current of the current source to the diode-coupled transistors. The differential pair is cross-coupled to the transistors 67 to provide and output signal $S_{out}$ with the same sense as that of the differential amplifiers 35 and 36 of FIG. 1.

Comparator systems of the invention may be used in various applications. FIG. 3, for example, illustrates an intermediate frequency (IF) to baseband receiver 80 that includes a variable-gain amplifier (VGA) 82, a mixer 83, a local oscillator (LO) 84 that drives the mixer, a multistage low-pass filter 85, an ADC 88 and a digital processor 90.

In operation of the receiver 80, a differential IF input signal is received through an input port 92, amplified by the VGA 82 and converted to baseband (or near baseband) by the mixer 84. The low-pass filter 85 provides an antialiasing function, rejects unwanted mixer products and passes the downconverted signals to the ADC which provides a corresponding digital signal to the processor 90.

The processor typically provides various functions such as digital filtering and passes the processed downconverted signal to an output port 94. In addition, the processor provides a gain-control signal which is passed through a feedback path 96 to control the gain of the VGA 82. Although the processor thus maintains the output signal at a user-programmable level, it generally cannot track large, rapid changes in the signal level that would temporarily overdrive the receiver. These signals cause the ADC to be overranged with the result that significant data in the output signal is lost before the control loop can recover.

Therefore, the receiver 80 also includes a differential comparator 100 in accordance with the teachings of one embodiment of the invention. The comparator is coupled to receive signals from the low-pass filter 85 and, in response to rapid overdrive signals, provide an overdrive protection feedback signal 102 that is passed by the processor through the feedback path 96 to immediately reduce the gain of the VGA 82 (and thereby override the normal gain-control function). It has been found that the comparator 100 significantly reduces the loss of data in the presence of overdrive signals.

The comparator 100 is preferably structured to provide the overdrive protection feedback signal 102 when the amplitude of the baseband signals is slightly below a level that would exceed the input range of the ADC 88. For this purpose, the comparator 20 of FIG. 1 may be altered to only include the $D_2$ and $D_n-1$ comparators that change state in response to signal amplitudes just below the full-scale signals that would normally be sensed by the comparators $D_1$ and $D_n$. When used for the comparator 100, the $D_2$ and $D_n-1$ comparators would provide the feedback signal 102 that prevents or reduces overranging of the ADC 88.

Figure 4:
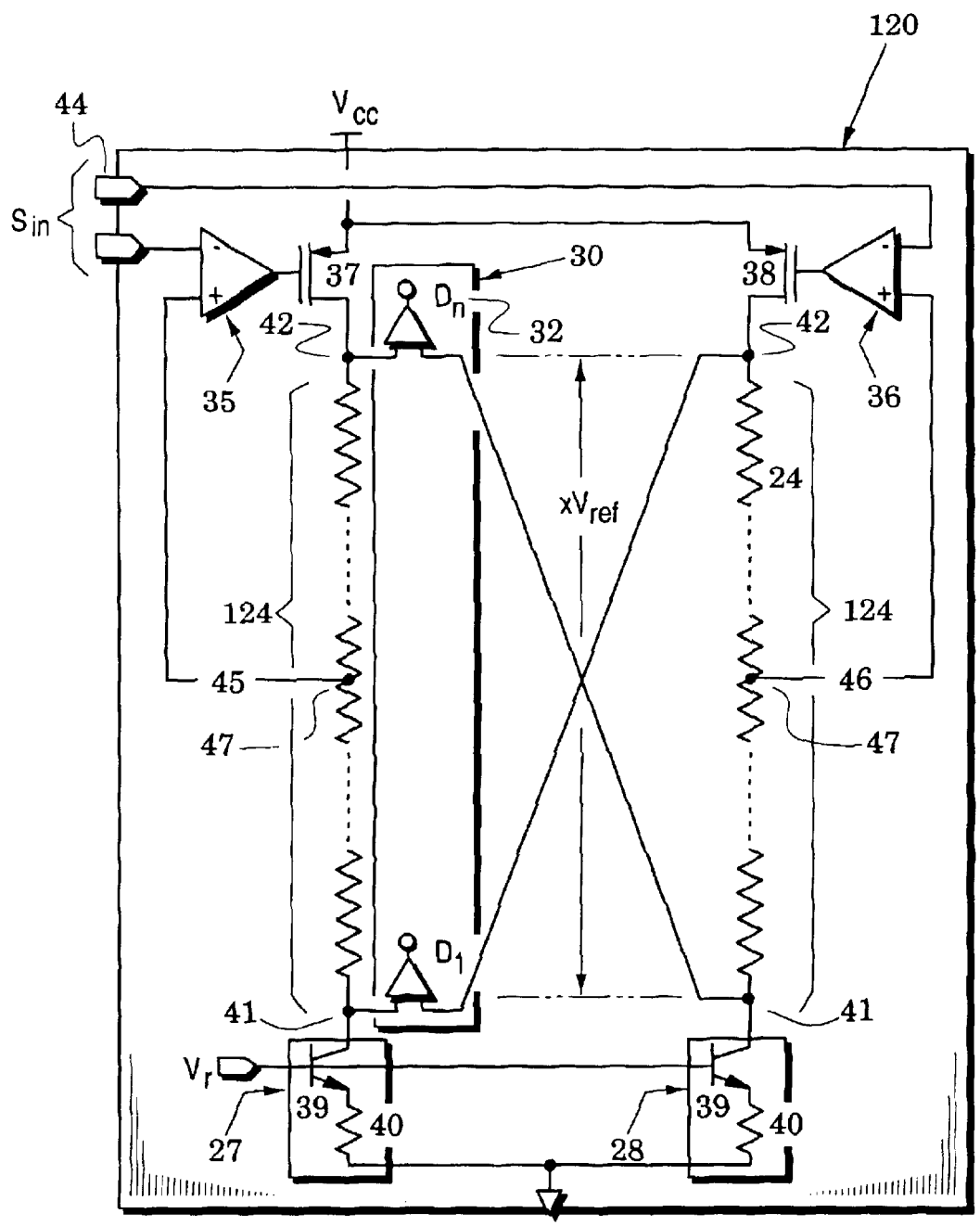
FIG. 4 is a schematic diagram of another differential comparator system embodiment.

Alternatively, the comparator 100 can be modified to take the simpler form of the comparator 120 of FIG. 4. This comparator is similar to the converter 20 of FIG. 1 with like elements indicated by like reference numbers. In contrast, however, the resistors 24 of the strings 21 and 22 of FIG. 1 have been reduced to single resistors 124 and all comparators are eliminated except the comparators $D_1$ and $D_n$ that are coupled across the first and second string taps 41 and 42. The feedback taps 47 are preferably centered in the resistors 124.

In this embodiment, the current sources 27 and 28 are provided with a bias $V_r$ that produces a current which reduces the voltage across the resistors 124 from the reference signal $V_{ref}$ of FIG. 1 to $xV_{ref}$ in which x is less than one (e.g., x=0.9). Thus the comparators $D_1$ and $D_n$ will change state just before the extremes of the full-scale range of the ADC (88 in FIG. 3) are reached. The comparator 100 will therefore provide an appropriate overdrive protection feedback signal (102 of FIG. 3) that reduces data loss in the receiver 80 of FIG. 3. The response of the comparator 100 can be programmed in various ways. For example, the current of the current sources 27 and 28 can be programmed to realize a desired or predetermined x in the $xV_{ref}$ applied across the strings 21 and 22.

Although the impedance elements of the strings (e.g., 21 and 22 in FIG. 1) are shown as resistors in FIGS. 1 and 4, it is noted that they may take other forms in other comparator embodiments.

Although the invention has been described with reference to specific transistor types (e.g., MOS and bipolar junction transistors) for descriptive clarity, the teachings of the invention may be practiced with various trnansistor families and the following claims are to be interpreted accordingly.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A differential comparator system, comprising:
   first and second strings each formed with at least one impedance element;
   at least one current source coupled to a first end of at least one of said first and second strings;
   at least one comparator coupled to provide a comparator output signal in response to signals at first and second string taps that are respectively positioned along said first and second strings; and
   first and second differential amplifiers that have first input terminals which together define a differential input port, that have second input terminals that are each coupled through a respective feedback path to a feedback tap positioned between the first and second ends of a respective one of said first and second strings, and that are each coupled to drive a second end of a respective one of said first and second strings;
   said system thus providing a comparator output signal in response to input signals at said differential input port.

2. The system of claim 1, further including first and second pass transistors each inserted between respective ones, of said first and second differential amplifiers and the respective second string ends driven by said amplifier.

3. The system of claim 1, wherein:
   said first and second strings each comprise a plurality of serially-coupled impedance elements; and said
   at least one comparator comprises a plurality of comparators coupled to each provide a portion of said comparator output signal in response to respective first and second taps that are respectively positioned along said first and second strings.

4. The system of claim 1, wherein said at least one current source comprises a first current source coupled to the first end of said first string and a second current source coupled to the first end of said second string.

5. The system of claim 1, wherein said impedance elements are resistors.

6. The system of claim 1, wherein each of said differential amplifiers includes:
   first and second diode-coupled transistors;
   a current source that provides an amplifier current; said first input comprising
   a differential pair of transistors that that are coupled to steer said amplifier current to said first and second diode-coupled transistors in response to said input signals.

7. An analog-to-digital converter, comprising:
   first and second strings each formed with at least one impedance element;
   at least one current source coupled to a first end of at least one of said first and second strings;
   at least one comparator coupled to provide a comparator output signal in response to signals at first and second string taps that are respectively positioned along said first and second strings;
   first and second differential amplifiers that have first input terminals which together define a differential input port, that have second input terminals that are each coupled through a respective feedback path to a feedback tap positioned between the first and second ends of a respective one of said first and second strings, and that are each coupled to drive a second end of a respective one of said first and second strings; and
   a decoder coupled to provide an output digital code in response to said comparator output signal;
   said converter thus providing an output digital code in response to input signals at said differential input port.

8. The converter of claim 7, further including first and second pass transistors each inserted between respective ones, of said first and second differential amplifiers and the respective second string ends driven by said amplifier.

9. The converter of claim 7, wherein:
   said first and second strings each comprise a plurality of serially-coupled impedance elements; and said
   at least one comparator comprises a plurality of comparators coupled to each provide a portion of said comparator output signal in response to respective first and second taps that are respectively positioned along said first and second strings.

10. The converter of claim 7, wherein said at least one current source comprises a first current source coupled to the first end of said first string and a second current source coupled to the first end of said second string.

11. The converter of claim 7, wherein said impedance elements are resistors.

12. The converter of claim 7, wherein each of said differential amplifiers includes:

first and second diode-coupled transistors;

current source that provides an amplifier current; said first input comprising a differential pair of transistors that are coupled to steer said amplifier current to said first and second diode-coupled transistors in response to said input signals.

13. A gain-controlled receiver that provides a digital output signal in response to an analog input signal, comprising:

an amplifier that processes said analog input signal to a level-controlled signal with a gain that varies in response to a feedback signal;

a mixer that provides a downconverted signal in response to said level-controlled signal;

an analog-to-digital converter that converts said downconverted signal to said digital output signal;

a differential comparator system that provides an out-of-range signal when said downconverted signal exceeds a predetermined range; and a processor that provides said feedback signal in response to said digital output signal in the absence of said out-of-range signal, and in response to the presence of said out-of-range signal, provides said feedback signal as an overdrive protection signal for said amplifier to said out-of-range signal, wherein said comparator system includes:
a) first and second strings each formed with at least one impedance element;
b) at least one current source coupled to a first end of at least one of said first and second strings;
c) at least one comparator coupled to provide said out-of-range signal in response to signals at first and second string taps that are respectively positioned along said first and second strings; and
d) first and second differential amplifiers that have first input terminals coupled to receive said downconverted signal, that have second input terminals that are each coupled through a respective feedback path to a feedback tap positioned between the first and second ends of a respective one of said first and second strings, and that are each coupled to drive a second end of a respective one of said first and second strings.

14. The receiver of claim 13, further including first and second pass transistors each inserted between a respective one of said first and second differential amplifiers and that amplifier's respective second end.

15. The receiver of claim 13, wherein said at least one current source comprises a first current source coupled to the first end of said first string and a second current source coupled to the first end of said second string.

16. The receiver of claim 13, wherein said impedance elements are resistors.

17. The receiver of claim 13, wherein each of said differential amplifiers includes;

first and second diode-coupled transistors;

a current source that provides an amplifier current; and a differential pair of transistors that provide said first input terminals and that are coupled to steer said amplifier current to said first and second diode-coupled transistors in response to said input signals.

18. The receiver of claim 13, further including a low-pass filter inserted between said mixer and said converter and wherein said differential comparator responds to a differential signal provided by said filter.

19. The receiver of claim 13, further including an oscillator that provides a local oscillator signal to said mixer.

20. The receiver of claim 13, wherein said processor responds to said digital output signal in the absence of said out-of-range signal.

* * * * *

UNITED STATES PATENT AND TRADEMARK OFFICE
CERTIFICATE OF CORRECTION

PATENT NO. : 6,833,800 B1
DATED : December 21, 2004
INVENTOR(S) : Gregory Wayne Patterson It is certified that error appears in the above-identified patent and that said Letters Patent is hereby corrected as shown below:

Column 8,
Lines 38-40, cancel claim 20.

Signed and Sealed this

Ninth Day of August, 2005

JON W. DUDAS
*Director of the United States Patent and Trademark Office*